United States Patent [19]

Ferrante

[11] Patent Number: 4,521,092
[45] Date of Patent: Jun. 4, 1985

[54] DEVELOPING LIGHT SENSITIVE PLATES INCLUDING USE OF ULTRASONIC WAVES
[75] Inventor: Mario Ferrante, Nancy, France
[73] Assignee: Photomeca S.A., Nancy, France
[21] Appl. No.: 496,110
[22] Filed: May 19, 1983
[30] Foreign Application Priority Data
May 25, 1982 [FR] France ................................ 82 09037
[51] Int. Cl.³ ............................................... G03D 3/08
[52] U.S. Cl. .................................... 354/320; 354/328;
134/184; 366/127; 430/3; 430/434
[58] Field of Search .............. 354/320, 321, 322, 328;
134/1, 184; 366/127; 430/3, 434
[56] References Cited
U.S. PATENT DOCUMENTS
2,945,760  7/1960  Ostergaad .......................... 354/328
3,690,758  9/1972  Knechtel et al. .................. 354/320
3,702,795  11/1972 Wessels et al. ..................... 134/184
4,179,208  12/1979 Martino .............................. 354/320
4,239,387  12/1980 Ahrens ............................... 354/328
4,383,751  5/1983  Schornig et al. ................... 354/322

FOREIGN PATENT DOCUMENTS
2075372  11/1981 United Kingdom .................... 430/3

Primary Examiner—A. A. Mathews
Attorney, Agent, or Firm—Murray, Whisenhunt and Ferguson

[57] ABSTRACT

In the developing of light sensitive plates, the plates are passed through a tank of developing liquid which is subject to ultrasonic waves to assist the developing action. The tank is preferably protected from the atmosphere to hinder degradation of the developing liquid.

5 Claims, 1 Drawing Figure

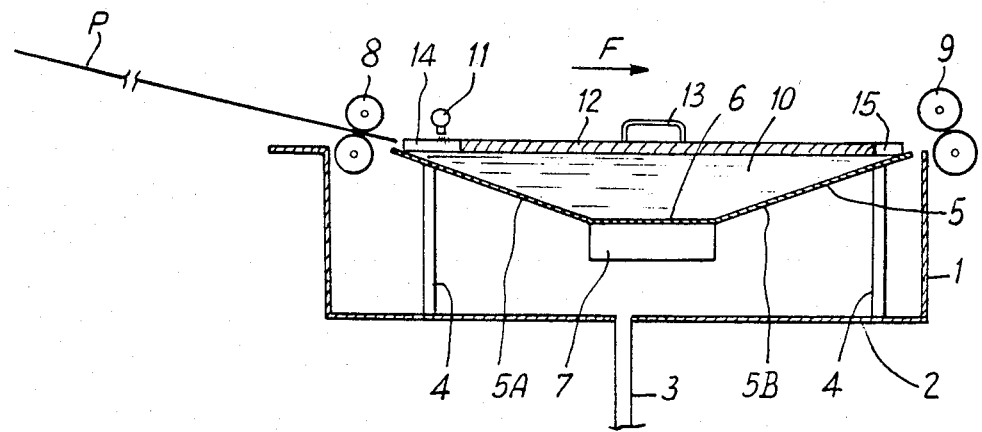

DEVELOPING LIGHT SENSITIVE PLATES INCLUDING USE OF ULTRASONIC WAVES

BACKGROUND OF THE INVENTION

This invention relates to the developing of light sensitive plates. The invention is particularly concerned with an improved process and apparatus which can be used e.g. for automatically developing relatively rigid, generally metallic positive or negative plates covered with a light-sensitive photopolymerisable layer on at least one side, used e.g. in offset printing or typographical or flexographical printing.

The exposure of the light-sensitive layer of a plate or sheet to suitable radiation has the effect of hardening or softening the parts affected by this radiation. The developing process has the function of eliminating the parts which will not be used for printing by means of a suitable solvent. Some plates can be developed by simply being soaked in a bath; other plates require brushing.

In the case of offset plates, it is found that there are a large number of manufacturers producing plates with the composition and hardness of the sensitive layers varying substantially from one manufacturer to another.

Thus one object of the invention is to provide the possibility of a versatile automatic process and apparatus capable of developing a wider range of the commercially available plates having a sensitive layer. The process and apparatus should be adaptable to the different formats of the plates and be capable of treating the various types of sensitive layers without impairing them and without requiring any complex adjustment.

A further problem with known systems is that some developing baths oxidise in the air. It is therefore very desirable to provide developing apparatus wherein the bath is protected from contact with the air, in spite of the diversity of conventional processes which are used depending on the nature of the sensitive layers, for example employing simple soaking, spraying under pressure, a friction sponge system and so forth.

SUMMARY OF THE INVENTION

Viewed from one aspect the invention can be considered to comprise a process for developing a relatively rigid plate having a light-sensitive layer, comprising the steps of;
(a) passing the plate through a bath of developing liquid; and
(b) subjecting the liquid to ultrasonic waves whilst the plate is immersed therein.

Viewed from another apsect the invention can be considered to comprise apparatus for developing a relatively rigid plate having a light sensitive layer, comprising:
(a) a tank adapted to hold a body of developing liquid;
(b) means for driving the plate through the body of liquid in the tank, and
(c) an ultrasonic transducer positioned to produce ultrasonic waves in the body of developing liquid.

In preferred embodiments of the invention a plate is soaked and preferably circulated in a bath of suitable developer whilst this bath is subjected to the effects of an ultrasound generator. The bath is contained in a tank and the transducer which generates the ultrasound in the bath is fixed to one wall of the tank, preferably on the outside. The tank is closed by a lid and the transducer may be fixed to the lid.

In a preferred embodiment the bath is contained in a first, concave tank and this first tank is in turn positioned within an outer tank. In this case, it is advantageous to place the transducer against the bottom of the first tank, on the outside thereof but inside the outer tank.

The ultrasound generator preferably has a minimum power of about 100 W and operates at a frequency in the range of 20,000 Hz to 50,000 Hz.

The process can be used with plates of all kinds and has the same degree of efficacy with all baths. It eliminates the need for brushes and the consequent soiling thereof and the risk of damage to the plates caused by mechanical friction. Even though the surface of the plates is frequently micrograined, the ultrasound will detach the light-sensitive layers at the bottom of the pores. Contrary to what would be expected, the liquid agitated by the ultrasound produces a frictional action which is more effective and less dangerous than that produced by mechanical means such as brushes. Moreover, the layer eliminated is immediately carried away from the plate so that the surface of the plate is kept cleaner than when brushes are used and the bath bites more sharply and deeply into the layer under attack. Oxidation of the bath (in the case of a liquid which is prone to oxidation) can be reduced since the exposed surface of the bath can be limited. Oxidation is further limited by the possibility of using a lid with which the bath may come into contact. Furthermore, the ultrasound causes effective removal of gas from the developer and thus limits the oxidation thereof.

BRIEF DESCRIPTION OF THE DRAWING

The single accompanying drawing is a diagrammatic view of a preferred embodiment of apparatus in accordance with the invention comprising a double tank for the developing of offset plates.

In the drawing a tank 1 has a base 2 provided with a drainage tube 3 and contains a load-bearing structure 4. The latter serves to support a concave tank or bath 5 which, more precisely, has a flat bottom portion 6 and two longitudinal walls 5A, 5B each sloping upwardly and outwards, and two vertical side walls. Mounted on the outside of the flat bottom portion 6 and inside the tank 1 is a transducer 7 which is connected by a cable (not shown) to a high frequency energy generator (not shown) installed outside the tank 1. This ultrasound equipment is commercially available; it operates a minimum power of 100 W and produces ultrasound at a frequency of from 20,000 to 50,000 Hz.

Near the upper edge of the walls 5A, 5B of the tank 5 there are two pairs of drive rolls, 8 and 9 respectively the axes of each pair being parallel and horizontal. The plates which are to be treated move in the direction indicated by the arrow F from the rolls 8 to the rolls 9. The complete system will comprise other treatment stations, namely rinsing, gumming and drying stations, which are completely conventional and need not be described here.

The tank 5 contains a liquid 10 suitable for the type of sensitive layer in the offset plates which are to be developed. A feed pipe 11 for the liquid is provided immediately downstream of the drive rolls 8, above the tank 5. This tank 5 is constantly supplied with fresh liquor at a suitable flow rate; the excess overflows into the tank 1 and is then emptied through the drainage tube 3. A lid 12 having a handle 13 may be placed between the walls 5A, 5B, resting on them with its edges, so as to be level with the surface of the liquid in the tank. This lid has an inlet opening 14 immediately downstream of the rolls 8 for the entry of the plates into the bath and for the feed of liquid via the pipe 11, and an outlet opening 15, immediately upstream of the rolls 9, for the exit of the plates.

The plates arrive at the tank 5 one by one in an inclined manner, as demonstrated by the plate P shown in the drawing, with their sensitive sides upwards, so that they can enter through the inlet opening 14. They are immersed in the liquid 10 until their front edges make contact with the upwardly inclined wall 5B. This wall then guides the plates towards the outlet opening 15 and the rolls 9 which grip the plate and carry it away. To enable the plate to enter more easily between the rolls 8 and 9, these rolls are inclined by a suitable amount relative to the vertical i.e. the planes containing the axes of each pair are inclined to the vertical. Naturally, the rolls 8 and 9 are spaced apart by a distance which is less than the length of the plates which are to be treated. The depth of the tank 5 is of the order of a few centimeters, for example 3 to 5 cm; in the drawing it is exaggerated in the interests of clarity.

Every kind of plate having a light-sensitive layer for offset or typographical or flexographical printing may be treated by the above process. The speed at which the plates are circulated through the bath depends on the concentration of developer in the bath; and average speed of from 1 m/min to 4 m/min can be achieved with the above process.

Depressions created by cavitation in the liquid due to the ultrasonic waves absorb the gases ($CO_2$ and $O_2$) which impair the quality of the developers. In the preferred embodiment, decarbonation and deoxidation double the service life of the chemical products used.

Obviously, modifications and variations of the present invention are possible in the light of the above teaching. It is therefore to be understood that, within the scope and spirit of the appended claims, the invention may be practised otherwise then as specifically described.

What is claimed is:

1. A process for developing a relatively rigid plate having thereon a light sensitive layer, regions of which have been exposed to light so as to alter the characteristic thereof thereby producing wanted and unwanted parts of the light sensitive layer, comprising the steps of:
   (a) passing the plate through a bath of developing liquid at a speed in the range of 1 to 4 meters per minute, on a continuous basis, said developing liquid removing the unwanted parts of the light sensitive layer from the plate,
   (b) protecting at least the major part of the surface of the developing liquid from contact with the atmosphere,
   (c) subjecting the developing liquid to ultrasonic waves whilst the plate is immersed therein to assist removal of the unwanted parts of the light sensitive layer without the use of friction from contact with mechanical means and to encourage the removal of unwanted gases from the developing liquid, the frequency of the ultrasonic waves being in the range of about 20,000 Hz to 50,000 Hz with a minimum power of 100 W.

2. Apparatus for developing a relatively rigid plate having a light sensitive layer comprising:
   (a) a tank having an entry and an outlet adapted to hold a body of developing liquid, said tank being concave with two longitudinally extending bottom walls each sloping upwardly and outwardly from a central bottom wall of the tank, an ultrasonic transducer being installed outside one wall of said tank, said ultrasonic transducer generating in the developing liquid ultrasonic waves in the range of about 20,000 Hz to 50,000 Hz, with a minimum power of 100 W;
   (b) means for driving the plate through the body of developing liquid in the tank at a speed in the range of about 1 to 4 meters per minute, said means comprising
      (i) first drive roll means adjacent an entry to the tank,
      (ii) second drive roll means adjacent an outlet of the tank, the spacing between the first and second drive roll means being less than the length of the plate and the first and second drive roll means being positioned adjacent the respective tops of the sloping bottom walls and each comprising a pair of rollers rotatable about parallel, horizontal axes, the planes containing the axes of each pair of rollers being inclined with respect to the vertical.

3. Apparatus according to claim 2, wherein said ultrasonic transducer is installed outside the central bottom wall of said tank.

4. Apparatus according to claim 2 further comprising:
   (a) a lid for the tank, adapted to be in contact with the surface of the liquid therein;
   (b) a first opening in the lid adjacent the first drive roll means to permit entry of the plate into the tank;
   (c) a second opening in the lid adjacent the second drive roll means to permit exit of the plate from the tank; and
   (d) means for supplying fresh liquid to the tank through one of the openings.

5. Apparatus according to claim 2 further comprising:
   (a) an outer tank, in which the first-mentioned tank is disposed, adapted to receive excess liquid from that tank; and
   (b) a drainage outlet from the outer tank.

* * * * *